(12) United States Patent
Carcasi et al.

(10) Patent No.: US 10,809,620 B1
(45) Date of Patent: Oct. 20, 2020

(54) SYSTEMS AND METHODS FOR DEVELOPER DRAIN LINE MONITORING

(71) Applicant: Tokyo Electron Limited, Tokyo (JP)

(72) Inventors: Michael Carcasi, Austin, TX (US); Mark Somervell, Austin, TX (US); Joshua Hooge, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/543,032

(22) Filed: Aug. 16, 2019

(51) Int. Cl.
  *G03F 7/16* (2006.01)
(52) U.S. Cl.
  CPC .................. *G03F 7/168* (2013.01)
(58) Field of Classification Search
  USPC ........................................ 396/611
  See application file for complete search history.

(56) References Cited

U.S. PATENT DOCUMENTS

| | | | | |
|---|---|---|---|---|
| 5,634,980 | A * | 6/1997 | Tomita | B08B 3/10 |
| | | | | 134/3 |
| 5,845,660 | A * | 12/1998 | Shindo | H01L 21/67028 |
| | | | | 134/56 R |
| 6,315,467 | B1 * | 11/2001 | Oishi | G03F 7/3071 |
| | | | | 396/578 |
| 2003/0044731 | A1 * | 3/2003 | Yoshihara | G03D 3/06 |
| | | | | 430/325 |
| 2003/0165756 | A1 * | 9/2003 | Ono | G03D 5/00 |
| | | | | 430/30 |
| 2004/0106072 | A1 * | 6/2004 | Itoh | G03F 7/30 |
| | | | | 430/329 |
| 2006/0086616 | A1 * | 4/2006 | Kurashina | C25D 5/22 |
| | | | | 205/83 |
| 2011/0056913 | A1 * | 3/2011 | Mayer | C23F 1/08 |
| | | | | 216/84 |
| 2012/0175239 | A1 * | 7/2012 | Aoshima | G03F 7/3092 |
| | | | | 203/11 |
| 2014/0238840 | A1 * | 8/2014 | Lee | B01D 3/143 |
| | | | | 203/32 |
| 2018/0079668 | A1 * | 3/2018 | Higuchi | C02F 1/72 |

FOREIGN PATENT DOCUMENTS

JP      2000100684 A  *  4/2000

* cited by examiner

*Primary Examiner* — Rodney E Fuller

(57) ABSTRACT

Various embodiments of systems and methods for drain line monitoring are disclosed herein. More specifically, a liquid dispense unit for a coating/developing processing system is provided herein for applying one or more liquid solutions to a substrate disposed within the liquid dispense unit. In the disclosed embodiments, a pH sensor and/or a line particle counter (LPC) is coupled to a drain line of the liquid dispense unit to monitor various parameters of the liquid waste, which is ejected from the substrate and disposed of through the drain line. In some embodiments, measurements obtained from the pH sensor may be used to optimize a develop process by detecting an endpoint of the develop process, avoiding pH shock and/or detecting excursions in the develop process. In some embodiments, measurements obtained from the LPC may additionally or alternatively be used to optimize the develop process.

18 Claims, 8 Drawing Sheets

SYSTEMS AND METHODS FOR DEVELOPER DRAIN LINE MONITORING

BACKGROUND

The present disclosure relates to the processing of substrates. In particular, it provides a novel method and system for developer drain line monitoring. In one embodiment, the method and system may be utilized for processing semiconductor substrates.

As geometries in substrate processing continue to shrink, the technical challenges to forming structures on substrates increase. Lithography techniques are particularly challenging for shrinking geometries. One traditional substrate lithography method utilizes a photolithography process which includes photoresist coating, exposure, and photoresist develop steps. The materials and processes utilized in these steps may all impact critical dimension targeting, line roughness, and uniformity on a substrate.

As the develop process is a critical step in substrate lithography processes, it would be desirable to provide an improved method and system for photoresist developing.

SUMMARY

Various embodiments of systems and methods for drain line monitoring are disclosed herein. More specifically, a liquid dispense unit for a coating/developing processing system is provided herein for applying one or more liquid solutions to a substrate disposed within the liquid dispense unit. In the disclosed embodiments, a pH sensor and/or a line particle counter (LPC) is coupled to a drain line of the liquid dispense unit to monitor various parameters of the liquid waste, which is ejected from the substrate and disposed of through the drain line. In some embodiments, measurements obtained from the pH sensor may be used to optimize a develop process by detecting an endpoint of the develop process, avoiding pH shock and/or detecting excursions in the develop process. In some embodiments, measurements obtained from the LPC may additionally or alternatively be used to optimize the develop process.

In some embodiments, the pH sensor coupled to the drain line is used to repeatedly measure a pH level of the liquid waste ejected from the substrate, and a pH metric obtained from the pH level measurements is used to control one or more operational parameters of the liquid dispense unit disclosed herein. In one embodiment, the pH levels measured by the pH sensor are used to: detect an endpoint of a develop process and begin a rinse process. In another embodiment, the pH levels measured by the pH sensor are used to calculate a rate of pH change over time, which may be used to avoid pH shock by slowly transitioning a pH level of a develop solution applied to the substrate during the develop process to a pH level of a rinse solution subsequently applied to the substrate during the rinse process. In yet another embodiment, the pH levels measured by the pH sensor are used to generate a pH sensor profile, which may be compared to a characteristic pH sensor profile to detect excursions in the develop process.

In some embodiments, the line particle counter (LPC) coupled to the drain line is used to detect an amount of conglomeration within the liquid waste ejected from the substrate, and a conglomeration metric obtained from said detecting is used to control one or more operational parameters of the liquid dispense unit.

According to one embodiment, a method is provided herein for processing a substrate disposed within a liquid dispense unit. Such a method may generally include applying one or more liquid solutions to the substrate disposed within the liquid dispense unit, collecting liquid waste ejected from the substrate, repeatedly measuring a pH level of the liquid waste ejected from the substrate, and using a pH metric obtained from said repeatedly measuring the pH level to control one or more operational parameters of the liquid dispense unit.

In some embodiments, said applying one or more liquid solutions to the substrate comprises applying a develop solution to the substrate during a develop process.

In some embodiments, said using the pH metric comprises using the pH levels measured during said measuring step to detect an endpoint of the develop process and begin a rinse process. For example, said using the pH metric may comprise comparing the pH levels of the liquid waste to a baseline pH level of the develop solution as the develop solution is being applied to the substrate, and detecting an endpoint of the develop process when the pH level of the liquid waste returns to the baseline pH level of the develop solution. In some embodiments, said using the pH metric may further comprise beginning a rinse process and applying a rinse solution to the substrate upon detecting the endpoint.

In some embodiments, said using the pH metric comprises using a rate of pH change over time to avoid pH shock by slowly transitioning a pH level of the develop solution to a pH level of a rinse solution subsequently applied to the substrate during a rinse process. In some embodiments, the pH level of the develop solution may be slowly transitioned to the pH level of the rinse solution by mixing an increasingly greater amount of the rinse solution with an increasingly lesser amount of the develop solution to gradually transition the pH level of the develop solution to the pH level of the rinse solution.

In some embodiments, said using the pH metric comprises comparing a pH sensor profile, which is obtained from said repeatedly measuring the pH level of the liquid waste ejected from the substrate, to a characteristic pH sensor profile to detect excursions in the develop process. In some embodiments, said using the pH metric may further comprise detecting excursions in the develop process if the pH sensor profile deviates significantly from the characteristic pH sensor profile, and flagging the substrate for inspection if one or more excursions are detected.

According to another embodiment, a method is provided herein for processing a substrate disposed within a liquid dispense unit. Such a method may generally include applying one or more liquid solutions to the substrate disposed within the liquid dispense unit, collecting liquid waste ejected from the substrate, detecting an amount of conglomeration within the liquid waste ejected from the substrate, and using a conglomeration metric obtained from said detecting the amount of conglomeration to control one or more operational parameters of the liquid dispense unit. In some embodiments, said using the conglomeration metric may comprise using the conglomeration metric to change at least one of: an exposure dose, a Post Application Bake (PAB), Post Exposure Bake (PEB) condition, a develop condition or a develop recipe.

According to yet another embodiment, a coating/developing processing system provided herein comprises a liquid dispense unit, which is configured to apply one or more liquid solutions to a substrate disposed within the liquid dispense unit. The liquid dispense unit comprises a processing chamber bounded by a chamber wall, a spin chuck disposed inside the chamber wall to provide support for the substrate, a nozzle disposed inside the chamber wall to apply the one or more liquid solutions onto the substrate. The liquid dispense unit further comprises a drain line that extends through the chamber wall to dispose of liquid waste ejected from the substrate, at least one sensor, which is coupled to the drain line to measure parameters of the liquid waste, a processor unit coupled to receive measurements from the at least one sensor and configured to generate a control signal based on the measurements, and a controller coupled to receive the control signal from the processor unit and configured to control one or more operational parameters of the liquid dispense unit in response thereto.

In some embodiments, the liquid dispense unit further comprises a liquid supply unit, which is coupled to supply the one or more liquid solutions to the nozzle. For example, the liquid supply unit and the nozzle may be configured to apply a develop solution to the substrate during a develop process, and sometime thereafter may be configured to apply a rinse solution to the substrate during a rinse process.

The at least one sensor coupled to the drain line of the liquid dispense unit may comprise a pH sensor and/or a line particle counter (LPC).

In some embodiments, the at least one sensor may comprise a pH sensor, which is configured to generate pH level measurements by repeatedly measuring a pH level of the liquid waste ejected from the substrate and disposed of through the drain line.

In one embodiment, the processor unit may be configured to: compare the pH level measurements to a baseline pH level of the develop solution as the develop solution is being applied to the substrate during the develop process, detect an endpoint of the develop process when the pH level measurements return to the baseline pH level of the develop solution, and generate the control signal when the endpoint is detected. Upon receiving the control signal from the processor unit, the controller may be configured to control operational parameters of the liquid supply unit to begin a rinse process and apply a rinse solution to the substrate.

In another embodiment, the processor unit may be configured to: use the pH level measurements from the pH sensor to calculate a rate of pH change over time, and generate a control signal based on the rate of pH change over time. Upon receiving the control signal from the processor unit, the controller may be configured to control operational parameters of the liquid supply unit to slowly transition a pH level of the develop solution to a pH level of a rinse solution subsequently applied to the substrate during a rinse process.

In yet another embodiment, the processor unit may be configured to: use the pH level measurements from the pH sensor to generate a pH sensor profile, compare the pH sensor profile to a characteristic pH sensor profile previously established for a particular resist platform and develop process, detect excursions in the develop process if the pH sensor profile deviates significantly from the characteristic pH sensor profile, and flag the substrate for inspection if excursions are detected.

In some embodiments, the at least one sensor may comprise a line particle counter (LPC), which is configured to measure an amount of conglomeration within the liquid waste ejected from the substrate and disposed of through the drain line. In such embodiments, the processor unit may be configured to use the amount of conglomeration measured by the LPC to control one or more operational parameters of the liquid dispense unit. For example, the processor unit may be configured to use the amount of conglomeration detected by the LPC to change at least one of: an exposure dose, a Post Application Bake (PAB), Post Exposure Bake (PEB) condition, a develop condition or a develop recipe.

In some embodiments, the at least one sensor may comprise a pH sensor and a line particle counter (LPC).

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Various embodiments of systems and methods for drain line monitoring are disclosed herein. More specifically, a liquid dispense unit for a coating/developing processing system is provided herein for applying one or more liquid solutions to a substrate disposed within the liquid dispense unit. In the disclosed embodiments, a pH sensor and/or a line particle counter (LPC) is coupled to a drain line of the liquid dispense unit to monitor various parameters of the liquid waste, which is ejected from the substrate and disposed of through the drain line. In some embodiments, measurements obtained from the pH sensor may be used to optimize a develop process by detecting an endpoint of the develop process, avoiding pH shock and/or detecting excursions in the develop process. In some embodiments, measurements obtained from the LPC may additionally or alternatively be used to optimize the develop process.

According to some embodiments, the pH sensor coupled to the drain line is used to repeatedly measure a pH level of the liquid waste ejected from the substrate, and a pH metric obtained from the pH level measurements is used to control one or more operational parameters of the liquid dispense unit disclosed herein. In one embodiment, the pH levels measured by the pH sensor are used to: detect an endpoint of a develop process and begin a rinse process. In another embodiment, the pH levels measured by the pH sensor are used to calculate a rate of pH change over time, which may be used to avoid pH shock by slowly transitioning a pH level of a develop solution applied to the substrate during the develop process to a pH level of a rinse solution subsequently applied to the substrate during the rinse process. In yet another embodiment, the pH levels measured by the pH sensor are used to generate a pH sensor profile, which may be compared to a characteristic pH sensor profile to detect excursions in the develop process.

According to some embodiments, the line particle counter (LPC) coupled to the drain line is used to detect an amount of conglomeration within the liquid waste ejected from the substrate, and a conglomeration metric obtained from said detecting is used to control one or more operational parameters of the liquid dispense unit.

Figure 1:
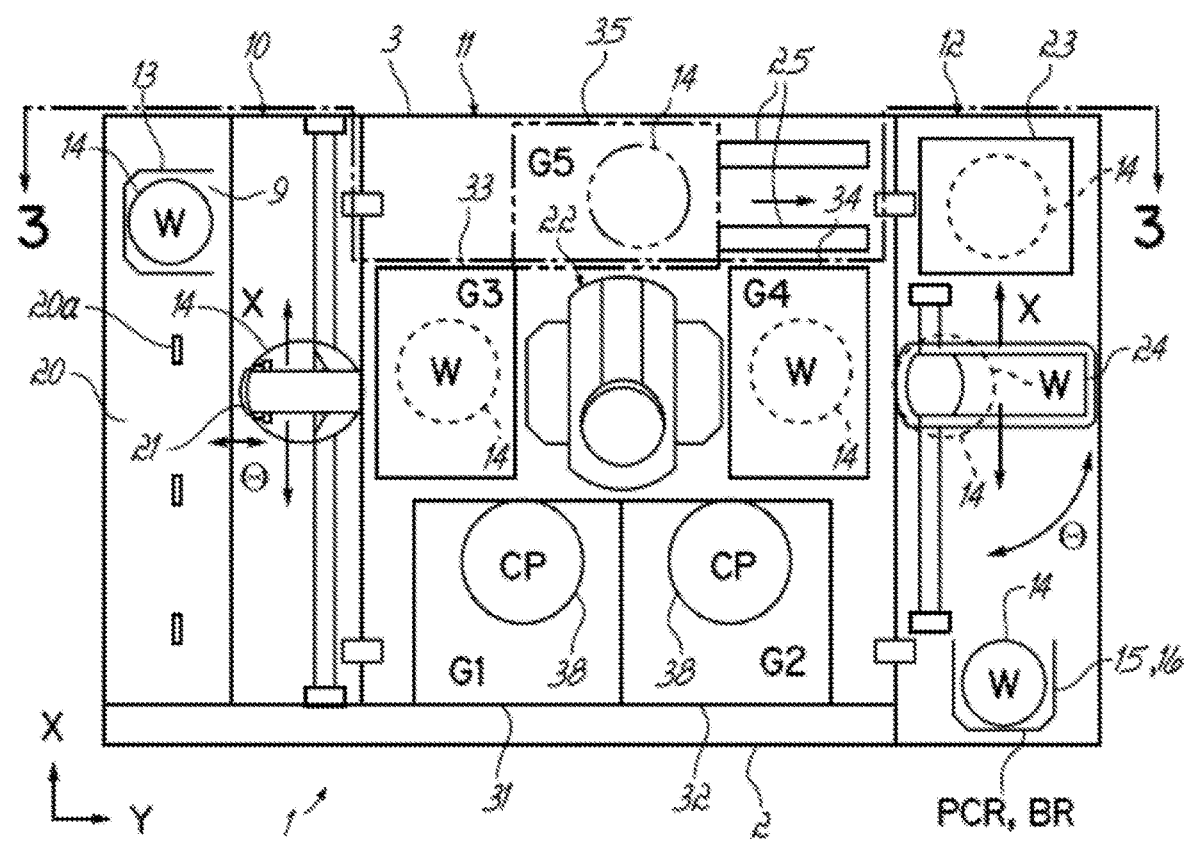
FIG. 1 (PRIOR ART) is a top view of a coating/developing processing system including a plurality of liquid dispense units.
Figure 2:
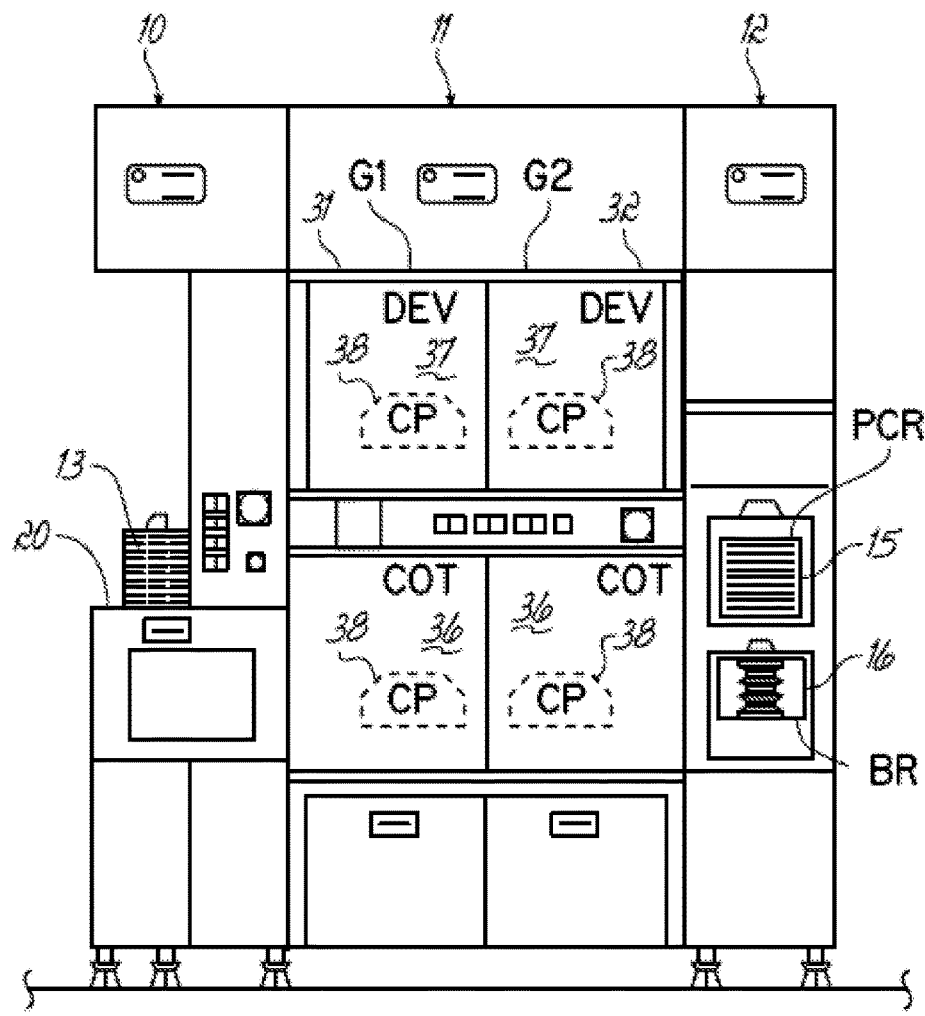
FIG. 2 (PRIOR ART) is a front view of the coating/developing processing system shown in FIG. 1.
Figure 3:
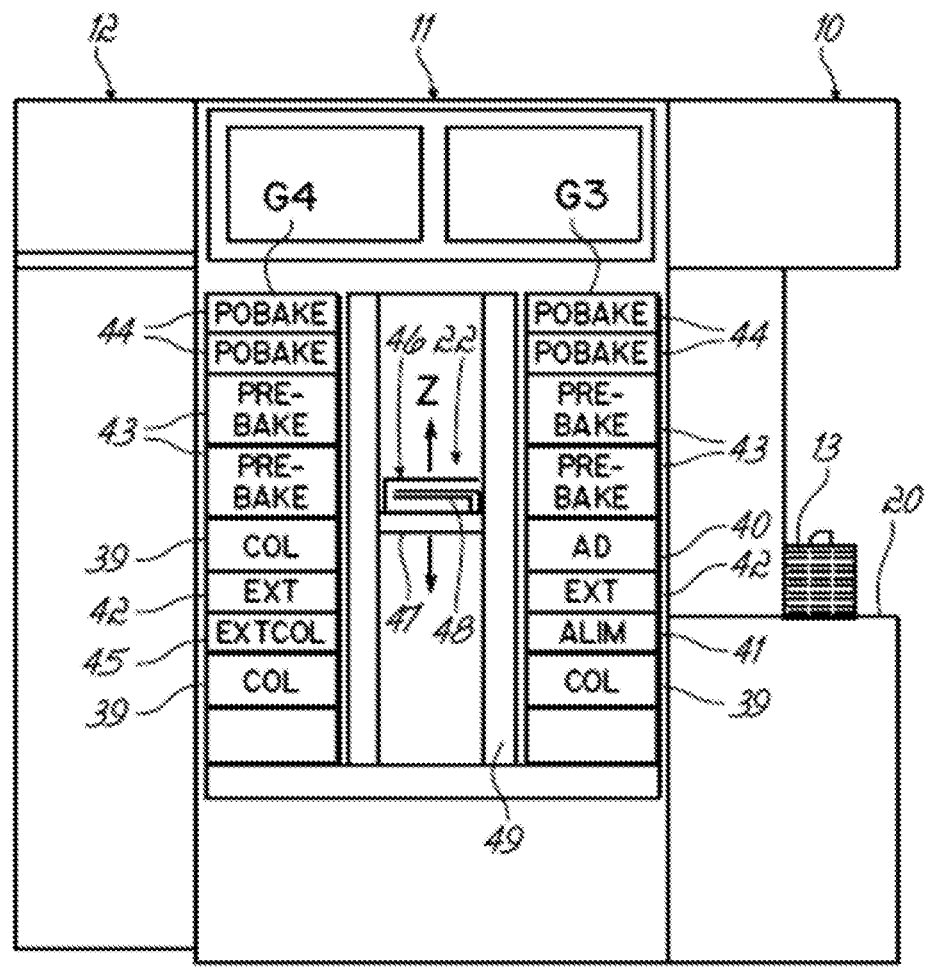
FIG. 3 (PRIOR ART) is a partially cut-away back view of the coating/developing processing system shown in FIG. 1, as taken along line 3-3.

FIGS. 1-3 illustrates an exemplary coating/developing processing system 1 in which the monitoring and control techniques described herein may be incorporated. As shown in FIGS. 1-3, coating/developing processing system 1 may include various components for processing substrates (e.g., semiconductor wafers) including one or more components that apply various liquids to substrates for processing purposes.

It will be recognized, however, that the coating/developing processing system 1 shown in FIGS. 1-3 is merely one example processing system in which the monitoring and control techniques described herein may be used. Thus, the disclosure of the processing system shown in FIGS. 1-3 is not meant to be limiting, but rather merely representative of one example processing system within which the monitoring and control techniques described herein may be utilized. Further, though the processing system of FIGS. 1-3 is described with reference to a system for processing substrates, which are semiconductor wafers, it will be recognized that the techniques described herein may be utilized with other types of substrates. Thus, it will be recognized that the monitoring and control techniques described herein may be utilized with a wide range of processing systems that apply liquids to a wide range of substrates.

With reference to FIGS. 1-3, a coating/developing processing system 1 may generally include a load/unload section 10, a process section 11, and an interface section 12. The load/unload section 10 has a cassette table 20 on which cassettes 13, each storing a plurality of semiconductor wafers (W) 14 (e.g., 25), are loaded and unloaded from the coating/developing processing system 1. The process section 11 has various single wafer processing units for processing the wafer 14 sequentially one by one. These processing units are arranged in predetermined positions of multiple stages, for example, within first (G1), second (G2), third (G3), fourth (G4) and fifth (G5) process unit group 31, 32, 33, 34, 35. The interface section 12 is interposed between the process section 11 and one or more light exposure systems (not shown), and is configured to transfer resist coated wafers between the process section. The one or more light exposure systems can include a resist patterning system, such as a photolithography tool that transfers the image of a circuit or a component from a mask or onto a resist on the wafer surface.

As shown in FIG. 1, the load/unload section 10 includes a plurality of projections 20a, which are formed on the cassette table 20 and used to orient each of the plurality of cassettes 13 relative to the process section 11. Each of the cassettes 13 mounted on the cassette table 20 has a load/unload opening 9 facing the process section 11. The load/unload section 10 further includes a first sub-arm mechanism 21 that is responsible for loading/unloading the wafer W into/from each of the cassettes 13. The first sub-arm mechanism 21 has a holder portion for holding the wafer 14, an X-axis moving mechanism (not shown) for moving the holder portion in an X-axis direction, a Y-axis moving mechanism (not shown) for moving the holder portion in a Y-axis direction, a Z-axis moving mechanism (not shown) for moving the holder portion in a Z-axis direction, and a θ (theta) rotation mechanism (not shown) for rotating the holder portion around the Z-axis. The first sub-arm mechanism 21 can gain access to an alignment unit (ALIM) 41 and an extension unit (EXT) 42 belonging to a third (G3) process unit group 33, as shown in FIG. 3 and described further below.

As shown in FIGS. 1 and 3, a main arm mechanism 22 is liftably arranged at the center of the process section 11. The process unit groups G1-G5 are arranged around the main arm mechanism 22. The main arm mechanism 22 is arranged within a cylindrical supporting body 49 and has a liftable wafer transporting system 46. The cylindrical supporting body 49 is connected to a driving shaft of a motor (not shown). The driving shaft may be rotated about the Z-axis in synchronism with the wafer transporting system 46 by an angle of θ. The wafer transporting system 46 has a plurality of holder portions 48 movable in a front and rear direction of a transfer base table 47.

As shown in FIG. 1, processing units belonging to first (G1) and second (G2) process unit groups 31, 32, are arranged at a front portion 2 of the coating/developing processing system 1. Processing units belonging to the third (G3) process unit group 33 are arranged next to the load/unload section 10. Processing units belonging to the fourth (G4) process unit group 34 are arranged next to the interface section 12. Processing units belonging to the fifth (G5) process unit group 35 are arranged in a back portion 3 of the coating/developing processing system 1.

With specific reference to FIG. 2, the first (G1) process unit group 31 and the second (G2) process unit group 32 each include two spinner-type processing units (i.e., liquid dispense units) for applying a predetermined treatment to the wafer 14, which is mounted on a spin chuck (not shown in FIG. 2) within a cup (CP) 38. In FIG. 2, the first (G1) process unit group 31 and the second (G2) process unit group 32 each include a resist coating unit (COT) 36 and a developing unit (DEV) 37, which are stacked in two stages sequentially from the bottom. In the exemplary system shown in FIG. 2, the resist coating unit (COT) 36 is set at a lower stage than the developing unit (DEV) 37 because a drain line (not shown in FIG. 2) for the resist waste solution is desired to be shorter than a drain line (not shown in FIG. 2) for the developing waste solution for the reason that the resist waste solution is more difficult to discharge than the developing waste solution. However, if necessary, the resist coating unit (COT) 36 may be arranged at an upper stage relative to the developing unit (DEV) 37.

As mentioned, the system of FIGS. 1-3 is merely exemplary. Thus, additional coating units may be utilized. For example, additional units may be provided for applying other layers utilized in a lithography process. Such additional layers may be, in some cases, spin-on layers. Thus, the coating/developing processing system 1 may be utilized to apply layers, such as spin-on hard masks, anti-reflective coatings (e.g., silicon anti-reflective coating (SiARC), bottom anti-reflective coating (BARC)), etc.

With specific reference to FIG. 3, the third (G3) process unit group 33 has a cooling unit (COL) 39, an alignment unit (ALIM) 41, an adhesion unit (AD) 40, an extension unit (EXT) 42, two prebaking units (PREBAKE) 43, and two postbaking units (POBAKE) 44, which are stacked sequentially from the bottom. Similarly, the fourth (G4) process unit group 34 has a cooling unit (COL) 39, an extension-cooling unit (EXTCOL) 45, an extension unit (EXT) 42, another cooling unit (COL) 39, two prebaking units (PREBAKE) 43 and two postbaking units (POBAKE) 44 stacked sequentially from the bottom. Although, only two prebaking units 43 and only two postbaking units 44 are shown, G3 and G4 may contain any number of prebaking units 43 and postbaking units 44. Furthermore, any or all of the prebaking units 43 and postbaking units 44 may be configured to perform Post Exposure Bake (PEB), Post Application Bake (PAB), Electrostatic Post Exposure Bake (EPEB), etc. procedures.

In some implementations, the cooling unit (COL) 39 and the extension cooling unit (EXTCOL) 45 are operated at low processing temperatures and arranged at lower stages, and the prebaking unit (PREBAKE) 43, the postbaking unit (POBAKE) 44 and the adhesion unit (AD) 40 are operated at high temperatures and arranged at the upper stages. Although thermal interference between units may be reduced with this arrangement, these units may have different arrangements in other implementations. In one exemplary implementation, the prebaking unit (PREBAKE) 43, the postbaking unit (POBAKE) 44, and the adhesion unit (AD) 40 can each include a PAB curing system in which wafer 14 is heated to temperatures above room temperature.

As shown in FIG. 1, a movable pick-up cassette (PCR) 15 and a non-movable buffer cassette (BR) 16 are arranged in two stages at the front side of the interface section 12. At the backside of the interface section 12, a peripheral light exposure system 23 is arranged. The peripheral light exposure system 23 may contain, for example, a lithography tool. Alternately, the lithography tool may be remote to, and cooperatively coupled to, the coating/developing processing system 1. At the center portion of the interface section 12, a second sub-arm mechanism 24 is provided, which is movable independently in the X and Z directions, and which is capable of gaining access to both cassettes (PCR) 15 and (BR) 16 and the peripheral light exposure system 23. In addition, the second sub-arm mechanism 24 is rotatable around the Z-axis by an angle of θ and is designed to be able to gain access not only to the extension unit (EXT) 42 located in the fourth (G4) process unit group 34 but also to a wafer transfer table (not shown) near a remote light exposure system (not shown).

As shown in FIG. 1, the fifth (G5) process unit group 35 may be arranged at the back portion 3 of the backside of the main arm mechanism 22. The fifth (G5) process unit group 35 may be slidably shifted in the Y-axis direction along a guide rail 25. Since the fifth (G5) process unit group 35 may be shifted as mentioned, maintenance operation may be applied to the main arm mechanism 22 easily from the backside.

As mentioned above, the system of FIGS. 1-3 is merely exemplary and the monitoring and control techniques described herein may be applied to a wide range of processing systems, all as would be recognized by one skilled in the art.

Figure 4:
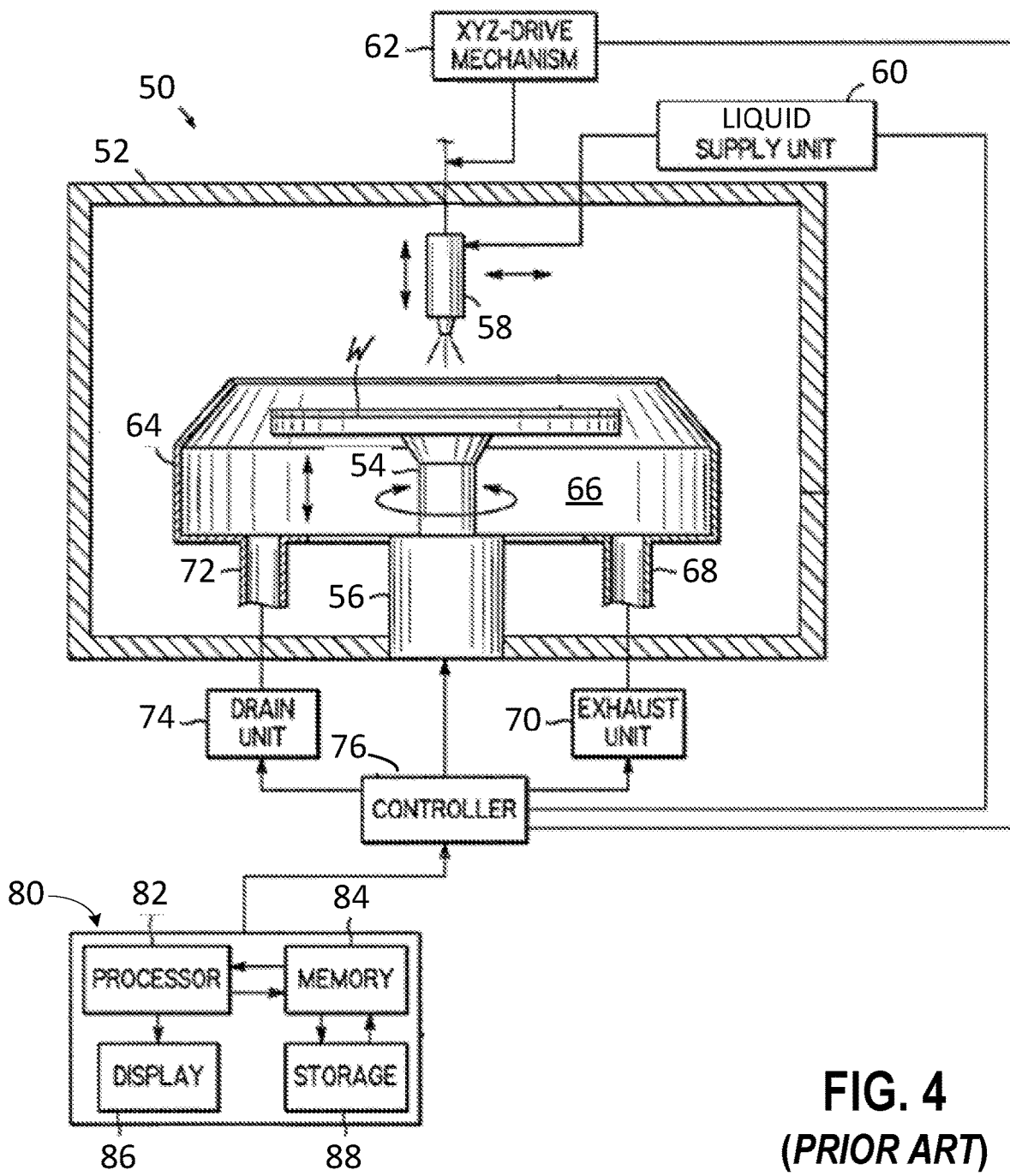
FIG. 4 (PRIOR ART) is a block diagram of a liquid dispense unit that may be included within the coating/developing processing system shown in FIG. 1 for applying liquid solutions to a substrate.

FIG. 4 illustrates an exemplary liquid dispense unit 50, which may be utilized for various liquid dispense stations (such as, for example, resist coating unit (COT) 36 and/or developing unit (DEV) 37) within which liquids are applied to a substrate for processing purposes. Again, it will be recognized that the liquid dispense unit 50 shown in FIG. 4 is merely one example of a processing unit within coating/developing processing system 1 in which the control and monitoring techniques described herein may be applied. Thus, the techniques disclosed herein may be applied to other liquid dispense units.

Substrates are coated with various processing liquids in liquid dispense unit 50, which may be part of, for example, resist coating unit (COT) 36, developing unit (DEV) 37 or other dispense units (e.g., spin-on hard mask units, spin-on anti-reflective coating units, etc.). As shown in FIG. 4, liquid dispense unit 50 may generally include a processing chamber bounded by a chamber wall 52. A spin chuck 54 disposed inside chamber wall 52 provides support for a substrate, which may be a semiconductor wafer (W). More specifically, the spin chuck 54 has a horizontal upper surface on which the wafer W is supported during processing. A suction port (not shown) may be provided in the horizontal upper surface of spin chuck 54 for securing the wafer W to the spin chuck with suction.

The spin chuck 54, and the wafer W supported by the spin chuck 54, may be rotated at a variable angular velocity by a drive mechanism 56, which may be a stepper motor, etc. Additionally, a lift drive source, such as a cylinder, may be provided in the drive mechanism 56 so the spin chuck 54 may move vertically relative to the chamber wall 52. The drive mechanism 56 may operate at various angular velocities for the application of the liquid material and flow of the liquid material onto the substrate.

A dispenser or nozzle 58 is adapted to dispense liquid solutions onto the wafer W at a specified rate. The nozzle 58 is coupled to a liquid supply unit 60, which is configured to control the temperature of and supply a specific volume for, a flow of a liquid material, which may comprise a develop solution, a resist solution, a quench solution, a rinse solution or other solutions. A drive mechanism 62 may move the nozzle 58 in the plane of the wafer W, as well as normal to the surface of the wafer W, in order to adjust the position of the nozzle 58 relative to the wafer W. The nozzle 58 and/or the liquid supply unit 60 may include a heater (not shown) for regulating the temperature of the liquid material applied to the substrate.

A cup 64 bounding a processing space 66 may be provided about the periphery of the spin chuck 54 to capture and collect a majority of the liquid material ejected from the wafer W by centrifugal forces generated during rotation by the spin chuck 54. The spin chuck 54 supports and rotates (i.e., spins) the wafer W about its central normal axis relative to the cup 64, which is stationary. An exhaust line 68 communicates with the processing space 66 bounded by the cup 64. The processing space 66 is coupled by the exhaust line 68, which extends through the chamber wall 52, with an exhaust unit 70, such as a vacuum pump or other negative pressure-generating device. Operation of the exhaust unit 70 continuously removes gaseous species (including but not limited to vapors released from wafer layers during processing) from the processing space 66 inside cup 64 at an exhaust rate. The processing space 66 bounded by the cup 64 is further coupled by a drain line 72 with a drain unit 74, which disposes of liquid material ejected from the wafer W, collected by the cup 64 and drained from the processing space 66 through drain line 72.

As shown in FIG. 4, a controller 76 may be electrically connected to various components of liquid dispense unit 50 including, but not limited to, spin chuck 54, drive mechanism 56, liquid supply unit 60, drive mechanism 62, exhaust unit 70, and drain unit 74. In general, controller 76 is configured to monitor parameters of the various components of liquid dispense unit 50 and to respond to changes in such parameters to adjust the performance of the liquid dispense unit. In some implementations, controller 76 may be connected to a processor unit 80, which is configured to provide the controller with modified parameter information to automatically adjust the performance of the liquid dispense unit 50.

The processor unit 80 may generally comprise a processor 82, a volatile memory 84, a display 86 and/or a nonvolatile storage device 88. The processor unit 80 may collect data from various components of the liquid dispense unit 50 and provide instructions to controller 76 to adjust various operational parameters of the liquid dispense unit. In order to do so, the processor unit 80 may be electrically connected to the various components of the liquid dispense unit 50, and more generally, to the various components of the coating/developing processing system 1.

The resist coating/develop process plays an important role in critical dimension targeting and uniformity, roughness, and overall defectivity observed in post track processing. Unfortunately, there is very limited monitoring, feedback and control of processing units (such as the liquid dispense unit 50 shown in FIG. 4) currently used to perform the resist coating/develop process. It would, therefore, be desirable to apply various monitoring and control techniques to the resist coating/develop process to improve the throughput of and optimize the resist coating/develop process, and to monitor and mitigate excursions (i.e., errors) in such process.

Figure 5:
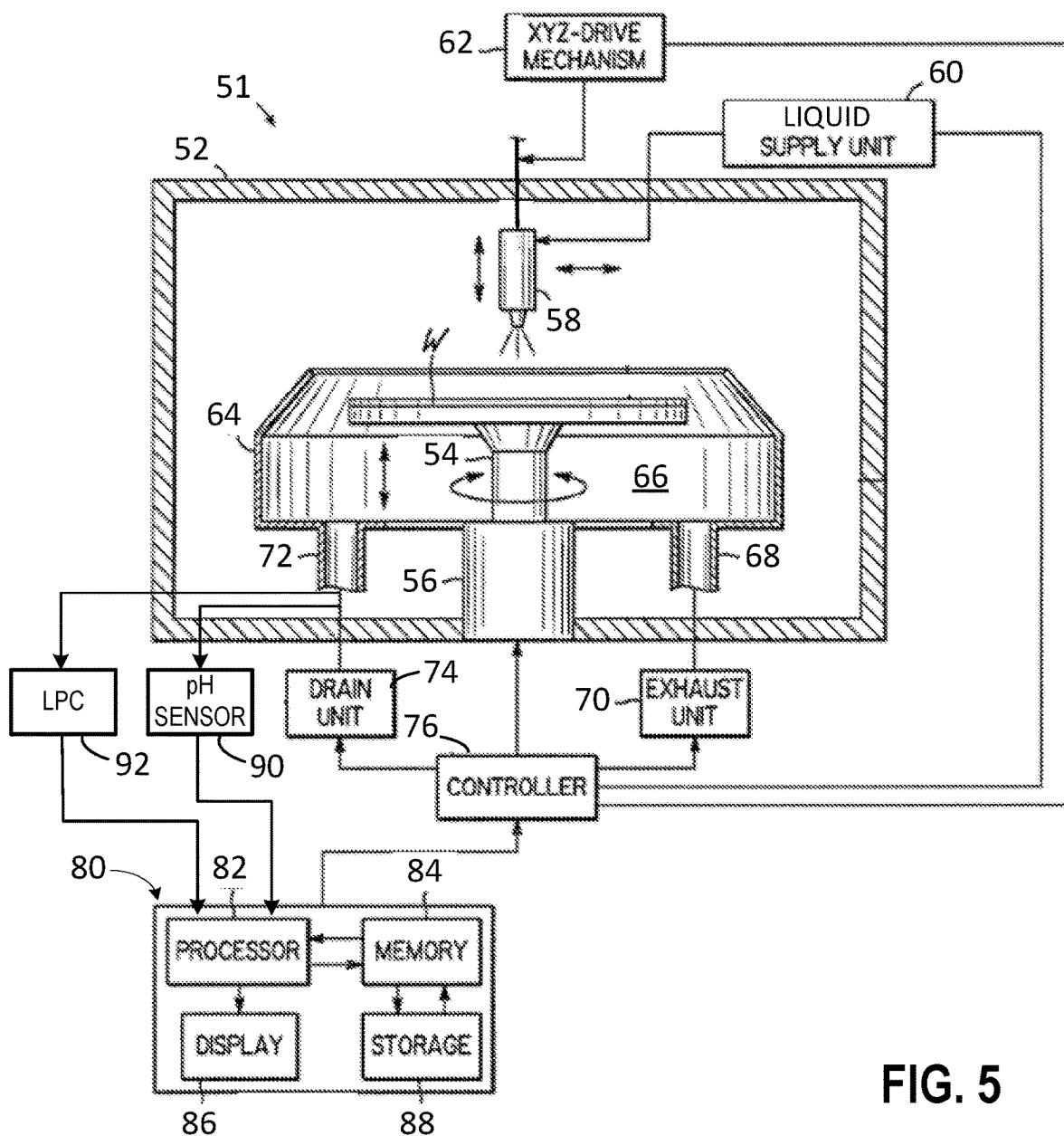
FIG. 5 is a block diagram of an improved liquid dispense unit for applying liquid solutions to a substrate, where the improved liquid dispense unit includes a pH sensor and/or a line particle counter (LPC) to monitor parameters of the liquid waste ejected from the substrate.

FIG. 5 illustrates an improved liquid dispense unit 51, which may be used for one or more liquid dispense stations (such as, for example, a resist coating unit (COT) 36 and/or a developing unit (DEV) 37) within a coating/developing processing system, such as the coating/developing processing system 1 shown in FIG. 1. Like the liquid dispense unit 50 shown in FIG. 4, the improved liquid dispense unit 51 shown in FIG. 5 may be configured to apply various liquids or liquid solutions (e.g., a develop solution, a resist solution, a quench solution, a rinse solution and/or other solutions) to a substrate, such as a semiconductor wafer (W), for processing purposes. For example, any of a wide range of positive tone develop solutions and negative tone develop solutions may be applied to the substrate including, but not limited to, buffered aqueous solutions developers (tetramethylammonium hydroxide (TMAH), tetrabutylammonium hydroxide (TBAH) potassium hydroxide (KOH), sodium hydroxide (NaOH) in deionized water); metal-ion free developers; solvents such as anisole, propylene glycol monomethyl ether acetate (PGMEA), propylene glycol methyl ether (PGME), n-butyl acetate (NBA), gamma-butryolactone (GBL), cyclohexanone, xylene, and methyl isobutyl ketone (MIBK); and other develop solutions. Many of the same components shown in FIG. 4 are also shown in FIG. 5.

For example, the improved liquid dispense unit 51 shown in FIG. 5 may generally include a processing chamber bounded by a chamber wall 52, a spin chuck 54 disposed inside the chamber wall 52 to provide support for a wafer W, and a drive mechanism 56 coupled to the spin chuck 54 to provide rotational motion and/or a lift force to the spin chuck and wafer W mounted thereon. In addition, the improved liquid dispense unit 51 may include a nozzle 58 disposed inside the chamber wall 52 to dispense liquid solutions (e.g., a develop solution, a resist solution, a quench solution, a rinse solution or other solutions) onto the wafer W at a specified rate, a liquid supply unit 60 coupled to the nozzle 58 and configured to control the temperature and volume of the dispensed liquid solution(s), and a drive mechanism 62 coupled to move the nozzle 58 in X, Y, and Z planes relative to the wafer W. Furthermore, the improved liquid dispense unit 51 may include a processing space 66 bounded by a cup 64, an exhaust line 68 that extends from the processing space 66 through the chamber wall 52 to an exhaust unit 70, and a drain line 72 that extends from the processing space 66 through the chamber wall 52 to a drain unit 74. Moreover, the improved liquid dispense unit 51 may include a controller 76 and a processor unit 80 connected to the controller 76. The controller 76 is electrically connected to various components of the liquid dispense unit 51 (such as, e.g., spin chuck 54, drive mechanism 56, liquid supply unit 60, drive mechanism 62, exhaust unit 70, and drain unit 74) for controlling operational parameters of the liquid dispense unit 51 based on control signals provided by the processor unit 80.

Unlike the liquid dispense unit 50 shown in FIG. 4, the improved liquid dispense unit 51 shown in FIG. 5 utilizes various monitoring and control techniques to improve the throughput of and optimize the resist coating/develop process, and to monitor and mitigate excursions (i.e., errors) in such process. As noted above, liquid waste ejected from the wafer W is collected by the cup 64 and removed from the processing space 66 via drain line 72, which extends through the chamber wall 52 of the liquid dispense unit 51 to connect to drain unit 74. In the example liquid dispense unit 51 shown in FIG. 5, a pH sensor 90 and a line particle counter (LPC) 92 are coupled to drain line 72 to measure various parameters of the liquid waste communicated there through. The parameters measured by pH sensor 90 and line particle counter (LPC) 92 are supplied to processor unit 80, which analyzes the measured parameters and provides control signals to controller 76 to control one or more operational parameters of the improved liquid dispense unit 51. Such operational parameters may include, but are not limited to, developer flow rate, developer dispense time, developer temperature, spin speed during developer dispense (revolutions per minute), developer nozzle scan rate, deionized water flow rate, deionized water dispense time, deionized water temperatures, spin speed during deionized dispense (revolutions per minute), etc. Although the liquid dispense unit 51 of FIG. 5 is shown as having both a pH sensor 90 and a LPC 92, it will be recognized that at least some of the benefits described herein may be obtained through the use of only one of these sensors.

pH sensor 90 measures or senses the pH of the liquid waste dispensed within drain line 72. In some embodiments, pH sensor 90 may include only a pH measuring electrode for measuring the pH of the liquid waste. In other embodiments, pH sensor 90 may include a pH measuring electrode for measuring the pH of the liquid waste, a reference electrode for measuring the pH of a reference solution, and/or a temperature electrode for measuring the temperature of the liquid waste. Various installation methods may be used to install the pH sensor 90 within the drain line 72. For example, pH sensor 90 may be a retractable pH sensor, a flow through pH sensor, an immersion pH sensor or a direct insertion pH sensor. In one example embodiment, pH sensor 90 may be but is not limited to a flow through pH sensor. It will be recognized, however, that other pH sensor configurations may be utilized.

As described in more detail below, pH sensor 90 measures the pH level of the liquid waste disposed of through the drain line 72 and provides the pH measurement to processor unit 80. Processor unit 80 uses a pH metric (e.g., a pH level, a rate of pH change over time, a pH sensor profile, etc.) obtained from the pH measurements provided by pH sensor

90 to optimize the resist coating/develop process by, for example, detecting an endpoint of a develop process, avoiding pH shock and/or detecting excursions in the resist coating/develop process.

Figure 6:
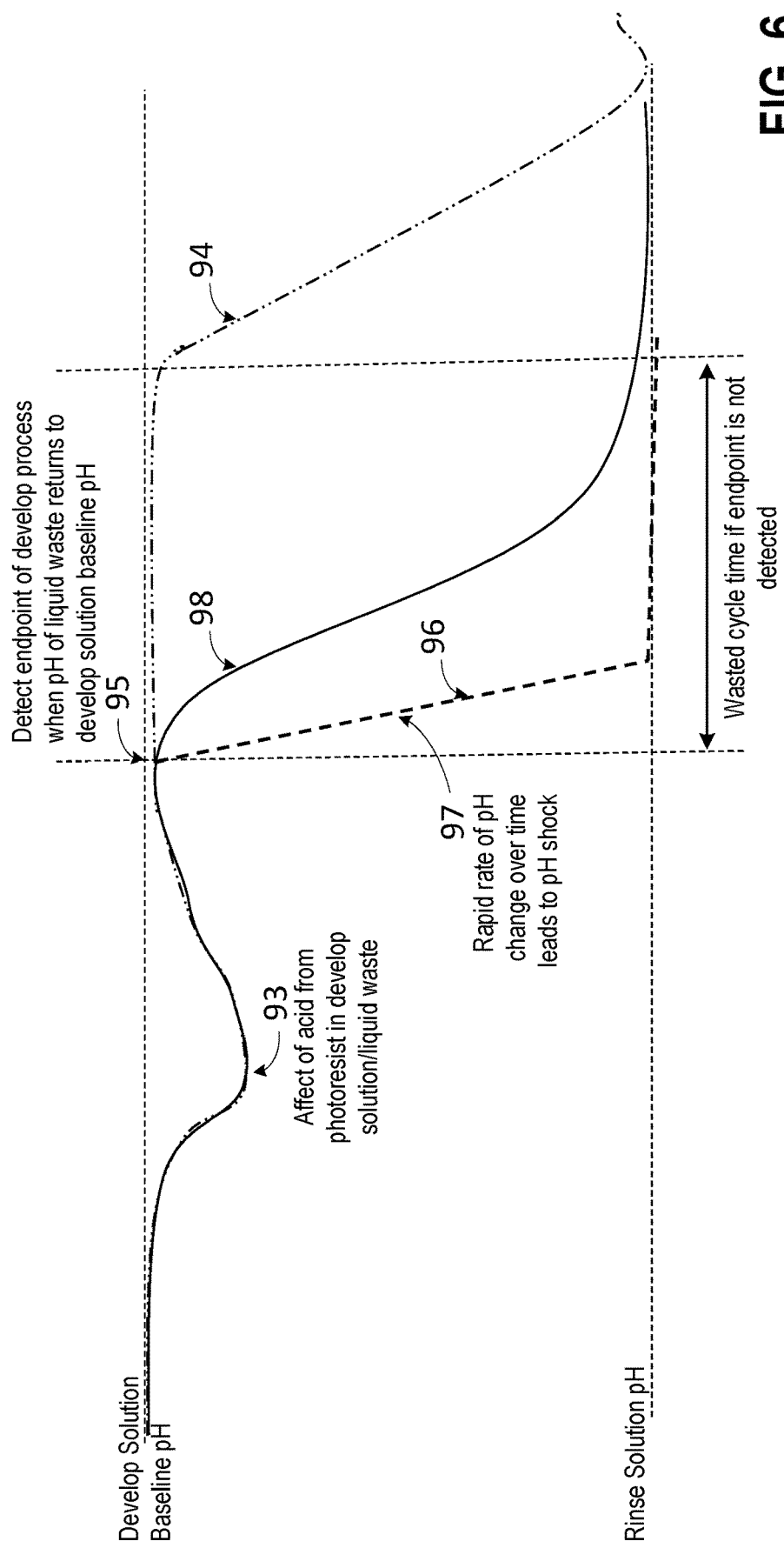
FIG. 6 is a graph illustrating various pH sensor profiles obtained from the pH sensor shown in FIG. 5.

In one embodiment, for example, processor unit 80 may use the pH level of the liquid waste to detect an endpoint of a develop process. As shown in FIG. 6, for example, a develop solution applied to the wafer W may have a baseline pH level of greater than 10. For example, TMAH may exhibit a pH of approximately 13.3. When using a develop solution to solvate out unprotected portions of a photoresist pattern on the wafer W, acids from the photoresist combine with the develop solution to reduce the pH level of the liquid waste ejected from the wafer W and disposed of through the drain line 72. The quench process that ensues further lowers the pH level of the liquid waste. When the trend reverses and pH level of the liquid waste returns to the baseline pH of the develop solution, the dissolutions processes are complete.

In some embodiments, processor unit 80 may compare the pH level of the liquid waste ejected from the wafer W to the baseline pH level of the develop solution as the develop solution is being applied to the wafer W, and may detect an endpoint of the develop process when the pH level of the liquid waste returns to the baseline pH level of the develop solution. When the endpoint is detected, processor unit 80 may supply a control signal to controller 76 to control operational parameters of the liquid supply unit 60 to begin the rinse process and apply a rinse solution to the wafer W. Since extending the dissolution processes beyond the detected endpoint (pH curve 94 of FIG. 6) wastes cycle time, using the pH level of the liquid waste to detect an endpoint of the develop process (pH curve 98 of FIG. 6) and begin a rinse process improves productivity and may, in some cases, reduce defectivity.

In another embodiment, processor unit 80 may use a rate of pH change over time to avoid pH shock. pH shock occurs when solvated resist particles/conglomerates fall out of solution due to the rapid change in pH (pH curve 96 of FIG. 6) from the baseline pH level of the develop solution to the neutral pH level of the rinse solution (e.g., deionized water). In some embodiments, processor unit 80 may use the pH measurements received from pH sensor 90 to calculate a rate of pH change over time, and may generate a control signal (based on the rate of pH change over time), which is supplied to controller 76. Upon receiving the control signal, controller 76 may adjust hardware component(s) of the liquid dispense unit 51 and/or processing step(s) to more slowly transition the pH level of the develop solution to the pH level of the rinse solution (pH curve 98 of FIG. 6) during the rinse process to avoid pH shock. In some cases, the transition from the develop solution to the rinse solution can be tailored to a particular resist platform.

In one example implementation, a mixing nozzle (not shown in FIG. 5) may be included within liquid supply unit 60 to mix the develop solution with the rinse solution at the beginning of the rinse process to more slowly transition the pH of the develop solution to the pH of the rinse solution. For example, an increasingly greater amount of rinse solution may be mixed with an increasingly lesser amount of develop solution to gradually transition the pH from the baseline pH level of the develop solution to the neutral pH level of the rinse solution, thereby avoiding pH shock. In another example implementation, a change in the rinse solution application method or timing may be used to more slowly transition the pH level of the develop and rinse solutions.

FIG. 6 is a graph illustrating various pH sensor profiles that may be obtained from pH sensor 90 when the pH level of the liquid waste ejected from a particular substrate configuration (e.g., a particular resist pattern) is measured over time for different develop process conditions. During the develop process, and as shown in pH curves 94, 96 and 98, acids from the photoresist combine with the develop solution to reduce the pH level of the liquid waste ejected from the wafer W (93) before the trend reverses and the pH level of the liquid waste returns to the baseline pH of the develop solution. pH curve 94 illustrates how cycle time is wasted if the endpoint of the develop process (95) is not detected when the pH of the liquid waste returns to the baseline pH of the develop solution. pH curve 96 illustrates how a rapid change in pH (97) from the baseline pH level of the develop solution to the neutral pH level of the rinse solution leads to pH shock. pH curve 98 illustrates an optimized pH sensor profile after adjustments have been made to the develop process to include endpoint detection and pH shock avoidance, as disclosed above.

In yet another embodiment, processor unit 80 may use a pH sensor profile to detect excursions (i.e., errors) in the resist coating/develop process. For example, processor unit 80 may use the pH measurements provided from the pH sensor 90 to generate a pH sensor profile, compare the pH sensor profile to a characteristic pH profile that was previously established for a particular resist platform and develop process. If the pH sensor profile deviates significantly from the characteristic pH profile, processor unit 80 may flag the wafer W for further examination due to suspected process deviations. For example, a significant deviation from the characteristic curve may imply that a significant change in the develop condition has occurred. This change may be driven by many things, such as a change of state of the develop solution (e.g., contaminated or old develop solution), an improper bake condition, a poor develop wetting condition, temperature errors, etc.

Line particle counter (LPC) 92 counts the amount of detectable conglomeration (i.e., a mixed mass or collection) of solvated particles within the liquid waste dispensed within drain line 72 and supplies a conglomeration metric (e.g., a number of detected solvated particles or clumps of solvated particles) to processor unit 80. High levels of conglomeration could be a sign of a process condition that may lead to excursions (i.e., errors) in the resist coating/develop process. For example, a high level of solvated resist particles may be a sign of various process excursions, including but not limited to, poor optical conditions such as low latent image contrast or low dose, poor PEB conditions (time, temp, etc.) that lead to low chemical latent image contrast (from insufficient diffusion or deprotection reactions), poor PAB conditions (time, temp, etc,) that induce changes in post exposure back effects, chemical aging, equipment aging, etc. As described in more detail below, processor unit 80 may use the conglomeration metric provided by LPC 92 to optimize the resist coating/develop process by, for example, changing the exposure dose, changing a PAB or PEB condition, and/or changing a develop condition or recipe. For example, the conglomeration may be highly correlated to pH levels and changes sensed by the LPC 92 may indicate pH level changes. Further, even if not correlated to the pH level, changes sensed by the LPC 92 may indicate the detection of a process excursion that is desirable to be flagged during processing. In some embodiments, the resist coating/develop process may be further optimized by using a conglomeration metric and a pH metric together to adjust hardware component(s) of the liquid dispense unit 51 and/or processing step(s).

It is noted that the controller(s) and processor(s) described herein can be implemented in a wide variety of manners. For example, they may be a computer. In another example, they may include one or more programmable integrated circuits that are programmed to provide the functionality described herein. For example, one or more processors (e.g., microprocessor, microcontroller, central processing unit, etc.), programmable logic devices (e.g., complex programmable logic device (CPLD)), field programmable gate array (FPGA), etc.), and/or other programmable integrated circuits can be programmed with software or other programming instructions to implement the functionality described herein for the controller(s) and processor(s). It is further noted that the software or other programming instructions can be stored in one or more non-transitory computer-readable mediums (e.g., memory storage devices, flash memory, dynamic random access memory (DRAM), reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

Figure 7:
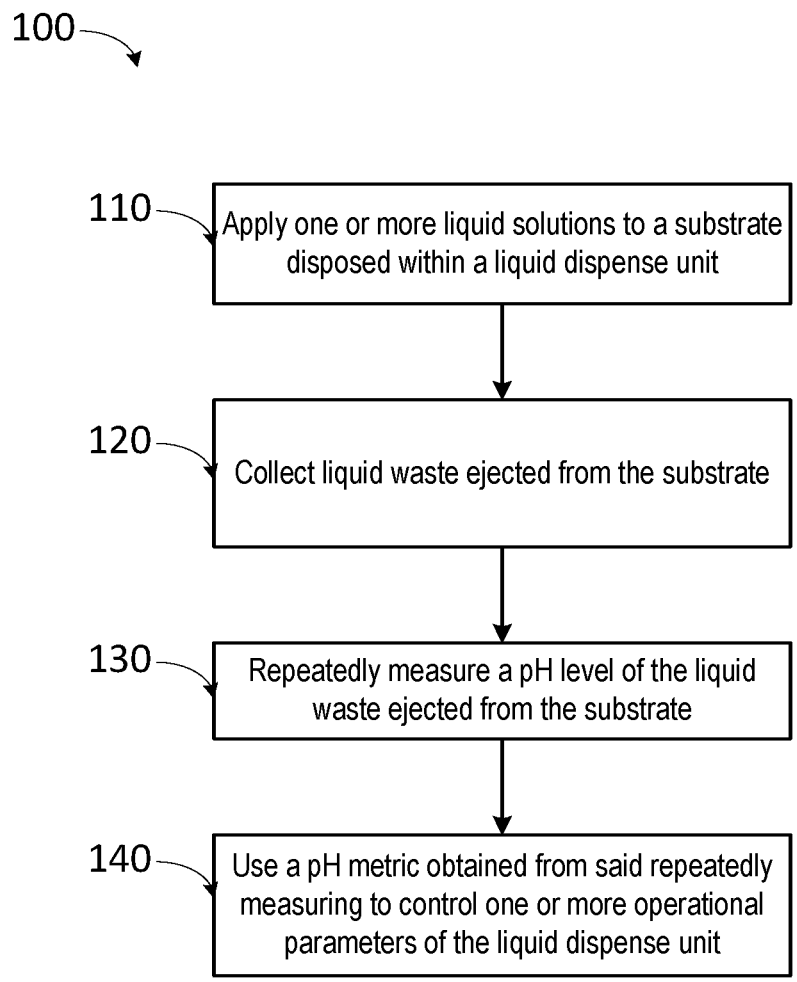
FIG. 7 is a flowchart diagram illustrating one embodiment of a method that may be used to process a substrate disposed within the liquid dispense unit of FIG. 5.
Figure 8:
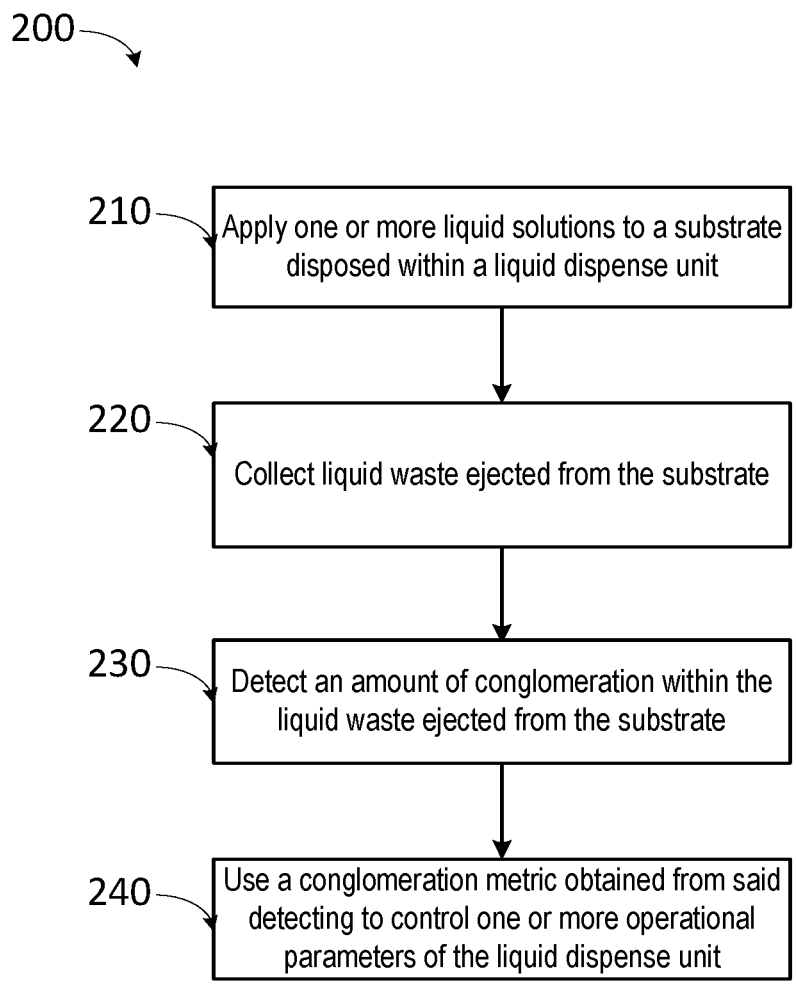
FIG. 8 is a flowchart diagram illustrating another embodiment of a method that may be used to process a substrate disposed within the liquid dispense unit of FIG. 5.

FIGS. 7 and 8 illustrate various embodiments of methods that implement the processing techniques described herein. More specifically, FIGS. 7 and 8 illustrate various embodiments of methods that may be used for processing a substrate disposed within a liquid dispense unit, such as but not strictly limited to, the improved liquid dispense unit 51 shown in FIG. 5. It will be recognized, however, that the embodiments shown in FIGS. 7 and 8 are merely exemplary and additional methods may utilize the techniques described herein. Further, additional processing steps may be added to the methods shown in the FIGS. 7 and 8, as the steps described are not intended to be exclusive. Moreover, the order of the steps is not limited to the order shown in FIGS. 7 and 8 as different orders may occur and/or various steps may be performed in combination or at the same time. Although illustrated in separate figures, one skilled in the art would understand how the methods may be combined, in some embodiments.

The method 100 shown in FIG. 7 may include applying one or more liquid solutions to a substrate disposed within a liquid dispense unit (in method step 110). For example, method step 110 may include applying a develop solution to the substrate during a develop process. Method 100 further includes collecting liquid waste ejected from the substrate (in step 120), repeatedly measuring a pH level of the liquid waste ejected from the substrate (in step 130), and using a pH metric obtained from said measuring to control one or more operational parameters of the liquid dispense unit (in step 140).

In some embodiments, the pH levels measured in step 130 may be the pH metric, which is used in step 140 to control one or more operational parameters of the liquid dispense unit. In such embodiments, step 140 may compare the pH levels of the liquid waste to a baseline pH level of the develop solution as the develop solution is being applied to the substrate, and may detect an endpoint of the develop process when the pH level of the liquid waste returns to the baseline pH level of the develop solution. Upon detecting the endpoint, step 140 may begin a rinse process by applying a rinse solution to the substrate.

In some embodiments, the pH metric used in step 140 may be a rate of pH change over time, which is calculated from the pH levels measured in step 130. In such embodiments, step 140 may use the rate of pH change over time to avoid pH shock by slowly transitioning a pH level of the develop solution to a pH level of the rinse solution applied to the substrate during the rinse process. In one example implementation, said slowly transitioning may include mixing an increasingly greater amount of the rinse solution with an increasingly lesser amount of the develop solution to gradually transition the pH level of the develop solution to the pH level of the rinse solution.

In some embodiments, the pH metric used in step 140 may be a pH sensor profile, which is obtained from the pH levels measured in step 130. In such embodiments, step 140 may compare the pH sensor profile to a characteristic pH sensor profile, detect excursions in the develop process if the pH sensor profile deviates significantly from the characteristic pH sensor profile, and flag the substrate for inspection if excursions are detected.

Like the method 100 shown in FIG. 7, the method 200 shown in FIG. 8 may include applying one or more liquid solutions to a substrate disposed within a liquid dispense unit (in step 210), and collecting liquid waste ejected from the substrate (in step 220). Unlike the previous embodiment, however, method 200 further includes detecting an amount of conglomeration within the liquid waste ejected from the substrate (in step 230), and using a conglomeration metric obtained from said detecting to control one or more operational parameters of the liquid dispense unit (in step 240). In some example implementations, the conglomeration metric may be used to change at least one of: an exposure dose, a Post Application Bake (PAB), Post Exposure Bake (PEB) condition, a develop condition or a develop recipe. In some embodiments, steps 110/210, 120/220, 130, 140, 230 and 240 may be combined.

It will be recognized that the method embodiments disclosed herein may be utilized during the processing of a wide range of substrates. The substrate may be any substrate for which the patterning of the substrate is desirable. For example, in one embodiment, the substrate may be a semiconductor substrate having one or more semiconductor processing layers (all of which together may comprise the substrate) formed thereon. Thus, in one embodiment, the substrate may be a semiconductor substrate that has been subject to multiple semiconductor processing steps which yield a wide variety of structures and layers, all of which are known in the substrate processing art, and which may be considered to be part of the substrate. For example, in one embodiment, the substrate may be a semiconductor wafer having one or more semiconductor processing layers formed thereon. The concepts disclosed herein may be utilized at any stage of the substrate process flow, for example, any of the numerous photolithography steps which may be utilized to form a completed substrate.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A method for processing a substrate disposed within a liquid dispense unit, the method comprising:
    applying one or more liquid solutions to the substrate disposed within the liquid dispense unit;
    collecting a liquid waste ejected from the substrate;
    repeatedly measuring a pH level of the liquid waste ejected from the substrate; and
    using a pH metric obtained from said repeatedly measuring the pH level to control one or more operational parameters of the liquid dispense unit,
    wherein said applying one or more liquid solutions to the substrate comprises applying a develop solution to the substrate during a develop process, and
    wherein said using the pH metric comprises comparing a pH sensor profile, which is obtained from said repeatedly measuring the pH level of the liquid waste ejected from the substrate, to a characteristic pH sensor profile to detect excursions in the develop process.

2. The method of claim 1, wherein said using the pH metric comprises using the pH levels measured during said repeatedly measuring to detect an endpoint of the develop process and begin a rinse process.

3. The method of claim 2, wherein said using the pH metric comprises:
    comparing the pH levels of the liquid waste to a baseline pH level of the develop solution as the develop solution is being applied to the substrate; and
    detecting the endpoint of the develop process when the pH level of the liquid waste returns to the baseline pH level of the develop solution.

4. The method of claim 3, wherein said using the pH metric further comprises applying a rinse solution to the substrate upon detecting the endpoint to begin the rinse process.

5. The method of claim 1, wherein said using the pH metric further comprises:
    detecting excursions in the develop process if the pH sensor profile deviates significantly from the characteristic pH sensor profile; and
    flagging the substrate for inspection if one or more excursions are detected.

6. A coating/developing processing system, comprising:
    a liquid dispense unit configured to apply one or more liquid solutions to a substrate disposed within the liquid dispense unit, wherein the liquid dispense unit comprises:
    a processing chamber bounded by a chamber wall;
    a spin chuck disposed inside the chamber wall to provide support for the substrate;
    a nozzle disposed inside the chamber wall to apply the one or more liquid solutions onto the substrate;
    a drain line that extends through the chamber wall to dispose of a liquid waste ejected from the substrate;
    at least one sensor coupled to the drain line to measure parameters of the liquid waste, wherein the at least one sensor comprises a pH sensor and optionally a line particle counter (LPC);
    a processor unit coupled to receive measurements from the at least one sensor and configured to generate a control signal based on the measurements;
    a controller coupled to receive the control signal from the processor unit and configured to control one or more operational parameters of the liquid dispense unit in response thereto; and
    a liquid supply unit coupled to supply the one or more liquid solutions to the nozzle, and wherein the liquid supply unit and the nozzle are configured to apply a develop solution to the substrate during a develop process,
    wherein the pH sensor is configured to generate pH level measurements by repeatedly measuring a pH level of the liquid waste ejected from the substrate and disposed of through the drain line, and
    wherein the processor unit is configured to:
        use the pH level measurements from the pH sensor to calculate a rate of pH change over time; and
        generate a control signal based on the rate of pH change over time, and
    wherein upon receiving the control signal from the processor unit, the controller is configured to control operational parameters of the liquid supply unit to slowly transition a pH level of the develop solution to a pH level of a rinse solution subsequently applied to the substrate during a rinse process.

7. The coating/developing processing system of claim 6, wherein the processor unit is further configured to:
    compare the pH level measurements to a baseline pH level of the develop solution as the develop solution is being applied to the substrate during the develop process;
    detect an endpoint of the develop process when the pH level measurements return to the baseline pH level of the develop solution; and
    generate the control signal when the endpoint is detected.

8. The coating/developing processing system of claim 7, wherein upon receiving the control signal from the processor unit, the controller is configured to control operational parameters of the liquid supply unit to begin a rinse process and apply a rinse solution to the substrate.

9. The coating/developing processing system of claim 6, wherein the processor unit is further configured to:
    use the pH level measurements from the pH sensor to generate a pH sensor profile;
    compare the pH sensor profile to a characteristic pH sensor profile previously established for a particular resist platform and develop process;
    detect excursions in the develop process if the pH sensor profile deviates significantly from the characteristic pH sensor profile; and
    flag the substrate for inspection if excursions are detected.

10. The coating/developing processing system of claim 6, wherein the line particle counter (LPC) is configured to measure an amount of conglomeration within the liquid waste ejected from the substrate and disposed of through the drain line.

11. The coating/developing processing system of claim 10, wherein the processor unit is configured to use the amount of conglomeration measured by the LPC to control one or more operational parameters of the liquid dispense unit.

12. The coating/developing processing system of claim 11, wherein the processor unit is configured to use the amount of conglomeration detected by the LPC to change at least one of: an exposure dose, a Post Application Bake (PAB), Post Exposure Bake (PEB) condition, a develop condition or a develop recipe.

13. The coating/developing processing system of claim 6, wherein the at least one sensor comprises the pH sensor and the line particle counter (LPC).

14. A method for processing a substrate disposed within a liquid dispense unit, the method comprising:

applying one or more liquid solutions to the substrate disposed within the liquid dispense unit;

collecting a liquid waste ejected from the substrate;

repeatedly measuring a pH level of the liquid waste ejected from the substrate; and using a pH metric obtained from said repeatedly measuring the pH level to control one or more operational parameters of the liquid dispense unit, wherein said applying one or more liquid solutions to the substrate comprises applying a develop solution to the substrate during a develop process, and wherein said using the pH metric comprises using a rate of pH change over time to avoid pH shock by slowly transitioning a pH level of the develop solution to a pH level of a rinse solution subsequently applied to the substrate during a rinse process.

15. The method of claim 14, wherein said slowly transitioning the pH level of the develop solution to the pH level of the rinse solution comprises:

mixing an increasingly greater amount of the rinse solution with an increasingly lesser amount of the develop solution to gradually transition the pH level of the develop solution to the pH level of the rinse solution.

16. The method of claim 14, wherein said using the pH metric comprises using the pH levels measured during said repeatedly measuring to detect an endpoint of the develop process and begin a rinse process.

17. The method of claim 16, wherein said using the pH metric comprises:

comparing the pH levels of the liquid waste to a baseline pH level of the develop solution as the develop solution is being applied to the substrate; and detecting the endpoint of the develop process when the pH level of the liquid waste returns to the baseline pH level of the develop solution.

18. The method of claim 17, wherein said using the pH metric further comprises applying a rinse solution to the substrate upon detecting the endpoint to begin the rinse process.

* * * * *